US007161247B2

(12) United States Patent
De Rege Thesauro et al.

(10) Patent No.: US 7,161,247 B2
(45) Date of Patent: Jan. 9, 2007

(54) POLISHING COMPOSITION FOR NOBLE METALS

(75) Inventors: Francesco De Rege Thesauro, Naperville, IL (US); Vlasta Brusic, Geneva, IL (US); Christopher C. Thompson, Earlville, IL (US); Benjamin P. Bayer, Aurora, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 254 days.

(21) Appl. No.: 10/901,420

(22) Filed: Jul. 28, 2004

(65) Prior Publication Data
US 2006/0024967 A1   Feb. 2, 2006

(51) Int. Cl.
*H01L 23/48* (2006.01)
*H01L 23/52* (2006.01)
*H01L 29/40* (2006.01)

(52) U.S. Cl. .................. 257/741; 438/690; 438/692
(58) Field of Classification Search ............... 257/741, 257/750, 762; 438/690, 692, 693
See application file for complete search history.

(56) References Cited

U.S. PATENT DOCUMENTS

| | | | |
|---|---|---|---|
| 5,637,028 A | 6/1997 | Haisma et al. | |
| 5,876,266 A | 3/1999 | Miller et al. | |
| 6,068,787 A | 5/2000 | Grumbine et al. | |
| 6,143,192 A | 11/2000 | Westmoreland | |
| 6,290,736 B1 | 9/2001 | Evans | |
| 6,326,305 B1 | 12/2001 | Avanzino et al. | |
| 6,395,194 B1 | 5/2002 | Russell et al. | |
| 6,419,554 B1 | 7/2002 | Chopra et al. | |
| 6,527,622 B1 | 3/2003 | Brusic et al. | |
| 6,537,462 B1 | 3/2003 | Westmoreland | |
| 6,576,554 B1 | 6/2003 | Matsui et al. | |
| 6,589,100 B1 | 7/2003 | Moeggenborg et al. | |
| 6,604,987 B1 | 8/2003 | Sun | |
| 6,605,539 B1 | 8/2003 | Lee et al. | |
| 6,641,630 B1 | 11/2003 | Sun | |
| 2001/0048161 A1 | 12/2001 | Chopra et al. | |
| 2002/0017063 A1 | 2/2002 | Beitel et al. | |
| 2002/0039839 A1 | 4/2002 | Thomas et al. | |
| 2002/0056701 A1 | 5/2002 | Westmoreland | |
| 2002/0056829 A1 | 5/2002 | Westmoreland | |
| 2002/0081853 A1 | 6/2002 | Beitel et al. | |
| 2002/0090820 A1 | 7/2002 | Sun et al. | |
| 2002/0102923 A1 | 8/2002 | Sugiyama et al. | |
| 2002/0106975 A1 | 8/2002 | Chopra et al. | |
| 2002/0109122 A1 | 8/2002 | Chopra et al. | |
| 2002/0111027 A1 | 8/2002 | Sachan et al. | |
| 2002/0115384 A1 | 8/2002 | Chopra et al. | |
| 2002/0125461 A1 | 9/2002 | Chou et al. | |
| 2003/0006396 A1 | 1/2003 | Wang et al. | |
| 2003/0092360 A1 | 5/2003 | Beitel et al. | |
| 2003/0119319 A1* | 6/2003 | Sinha et al. ............... 438/691 |
| 2003/0121891 A1 | 7/2003 | Westmoreland | |
| 2003/0124360 A1 | 7/2003 | Reihs et al. | |
| 2003/0124867 A1 | 7/2003 | Lee | |
| 2003/0139116 A1 | 7/2003 | Moeggenborg et al. | |
| 2003/0153107 A1 | 8/2003 | Stierman et al. | |
| 2003/0181142 A1 | 9/2003 | De Rege Thesauro et al. | |
| 2003/0194879 A1 | 10/2003 | Small et al. | |
| 2003/0194959 A1 | 10/2003 | Grumbine et al. | |
| 2003/0203633 A1 | 10/2003 | Sinha | |
| 2003/0207214 A1 | 11/2003 | Futase et al. | |
| 2003/0228762 A1 | 12/2003 | Moeggenborg et al. | |
| 2003/0234184 A1 | 12/2003 | Liu et al. | |
| 2004/0006924 A1 | 1/2004 | Scott et al. | |

FOREIGN PATENT DOCUMENTS

| | | | |
|---|---|---|---|
| EP | 1123956 A1 | | 8/2001 |
| JP | 411080708 A | * | 3/1999 |
| WO | WO 01/44396 A1 | | 6/2001 |
| WO | WO 03/056620 A1 | | 7/2003 |
| WO | WO 03/059571 A1 | | 7/2003 |
| WO | WO 03/060980 A2 | | 7/2003 |
| WO | WO 03/062338 A1 | | 7/2003 |
| WO | WO 03/064551 A1 | | 8/2003 |
| WO | WO 03/068883 A1 | | 8/2003 |
| WO | WO 03/072683 A1 | | 9/2003 |
| WO | WO 03/087178 A1 | | 10/2003 |
| WO | WO 03/104343 A2 | | 12/2003 |

OTHER PUBLICATIONS

Goia et al., *New Journal of Chemistry*, 5(11), 1203-1215 (1998).
Hegde et al., *Electrochemical and Solid-State Letters*, 6(10), G126-G129 (2003).
Larsen et al., *Analytical Chemistry*, 31(2), 176-178 (1959).
Mills et al., *Journal of the Chemical Society Faraday Transactions 1*, 84(2), 379-390 (1988).
Mills et al., *Journal of the Chemical Society Faraday Transactions*, 86(6), 955-958 (1990).
Martin, *Journal of the Chemical Society*, 3055-3059 (1952).

* cited by examiner

*Primary Examiner*—Phuc T. Dang
(74) *Attorney, Agent, or Firm*—Thomas Omholt; Frank Koszyk

(57) ABSTRACT

The invention provides a polishing composition and a method of chemically-mechanically polishing a substrate comprising a noble metal, the polishing composition comprising (a) an oxidizing agent that oxidizes a noble metal, (b) an anion selected from the group consisting of sulfate, borate, nitrate, and phosphate, and (c) a liquid carrier. The invention further provides a polishing composition and a method of chemically-mechanically polishing a substrate comprising ruthenium, the polishing composition comprising (a) an oxidizing agent that oxidizes ruthenium above the +4 oxidation state, (b) a polishing additive selected from the group consisting of metal sequestering polymers, metal chelators, organic thiols, compounds that reduce ruthenium tetraoxide, lactones, and α-hydroxycarbonyl compounds.

26 Claims, No Drawings

POLISHING COMPOSITION FOR NOBLE METALS

FIELD OF THE INVENTION

The invention pertains to polishing compositions and methods of chemically-mechanically polishing substrates comprising noble metals.

BACKGROUND OF THE INVENTION

Compositions and methods for planarizing or polishing the surface of a substrate are well known in the art. Polishing compositions (also known as polishing slurries) typically contain an abrasive material in an aqueous solution and are applied to a surface by contacting the surface with a polishing pad saturated with the slurry composition. Typical abrasive materials include silicon dioxide, cerium oxide, aluminum oxide, zirconium oxide, and tin oxide. U.S. Pat. No. 5,527,423, for example, describes a method for chemically-mechanically polishing a metal layer by contacting the surface with a polishing slurry comprising high purity fine metal oxide particles in an aqueous medium. Alternatively, the abrasive material may be incorporated into the polishing pad. U.S. Pat. No. 5,489,233 discloses the use of polishing pads having a surface texture or pattern, and U.S. Pat. No. 5,958,794 discloses a fixed abrasive polishing pad.

Conventional polishing systems and polishing methods typically are not entirely satisfactory at planarizing semiconductor wafers. In particular, polishing compositions and polishing pads can have less than desirable polishing rates, and their use in the chemical-mechanical polishing of semiconductor surfaces can result in poor surface quality. Because the performance of a semiconductor wafer is directly associated with the planarity of its surface, it is crucial to use a polishing composition and method that results in a high polishing efficiency, uniformity, and removal rate and leaves a high quality polish with minimal surface defects.

The difficulty in creating an effective polishing system for semiconductor wafers stems from the complexity of the semiconductor wafer. Semiconductor wafers are typically composed of a substrate, on which a plurality of transistors has been formed. Integrated circuits are chemically and physically connected into a substrate by patterning regions in the substrate and layers on the substrate. To produce an operable semiconductor wafer and to maximize the yield, performance, and reliability of the wafer, it is desirable to polish select surfaces of the wafer without adversely affecting underlying structures or topography. In fact, various problems in semiconductor fabrication can occur if the process steps are not performed on wafer surfaces that are adequately planarized.

Various metals and metal alloys have been used to form electrical connections between devices, including titanium, titanium nitride, aluminum-copper, aluminum-silicon, copper, tungsten, platinum, platinum-tungsten, platinum-tin, ruthenium, and combinations thereof. Noble metals, including ruthenium, iridium, and platinum, will be increasingly used in the next generation of memory devices and metal gates. Noble metals present a particular challenge in that they are mechanically hard and chemically resistant, making them difficult to remove efficiently through chemical-mechanical polishing. As the noble metals are often components of substrates comprising softer and more readily abradable materials, including dielectric materials such as silicon dioxide, problems of selectivity in preferential polishing of the noble metals versus over-polishing of the dielectric materials frequently arise.

Chemical-mechanical polishing compositions developed for polishing of substrates comprising ruthenium present an additional challenge. The polishing compositions typically include an oxidizing agent to convert ruthenium metal into either a soluble form or into a soft oxidized film that is removed by abrasion. Strong oxidizing agents that provide useful removal rates for ruthenium at low pH are capable of converting ruthenium into ruthenium tetraoxide which is a highly toxic gas, necessitating special precautions for its containment and abatement during chemical-mechanical polishing operations.

The following patents disclose polishing compositions for noble metals. U.S. Pat. No. 5,691,219 discloses a semiconductor memory device comprising a noble metal conductive layer and a polishing composition comprising a halo-compound for polishing the noble metal. U.S. Pat. No. 6,274,063 discloses polishing compositions for nickel substrates comprising a chemical etchant (e.g., aluminum nitrate), abrasive particles, and an oxidizer. U.S. Pat. No. 6,290,736 discloses a chemically active polishing composition for noble metals comprising an abrasive and a halogen in basic aqueous solution. JP 63096599 A2 discloses a method of dissolving metallic ruthenium. JP 11121411 A2 discloses a polishing composition for platinum group metals (e.g., Ru, Pt) comprising fine particles of an oxide of the platinum group metal. JP 1270512 A2 discloses a dissolving solution for noble metals comprising hydrogen peroxide, alkali cyanide, and phosphate ion and/or borate ion. WO 00/77107 A1 discloses a polishing composition for noble metals (e.g., Ru, Rh, Pd, Os, Ir, Pt) comprising an abrasive, a liquid carrier, an oxidizer, and a polishing additive that can include EDTA, nitrogen-containing macrocycles (e.g., tetraazacyclotetradecanes), crown ethers, halides, cyanides, citric acid, phosphines, and phosphonates. WO 01/44396 A1 discloses a polishing composition for noble metals comprising sulfur-containing compounds, abrasive particles, and water-soluble organic additives which purportedly improve the dispersion of the abrasive particles and enhance metal removal rates and selectivity. U.S. Pat. No. 6,395,194 discloses a polishing composition for noble metals and/or noble metal alloys comprising abrasive polishing particles, a bromide compound, a bromate compound which provides free bromine as an oxidizing agent, and an organic acid which mediates decomposition of the bromate compound in the composition, wherein the aqueous polishing composition comprises at least one bromine-chloride complex in an aqueous medium. U.S. Pat. No. 6,527,622 discloses a polishing composition for noble metals comprising an abrasive and/or a polishing pad, a liquid carrier, and one or more polishing additives selected from the group consisting of diketones, diketonates, urea compounds, heterocyclic nitrogen-containing compounds, heterocyclic oxygen-containing compounds, heterocyclic phosphorus-containing compounds, and nitrogen-containing compounds that can be zwitterionic compounds, wherein the additives purportedly interact with the noble metal surface and promote its dissolution during chemical-mechanical polishing.

A need remains, however, for polishing systems and polishing methods that will exhibit desirable planarization efficiency, uniformity, and removal rate during the polishing and planarization of substrates comprising noble metals, while minimizing defectivity, such as surface imperfections and damage to underlying structures and topography during polishing and planarization.

The present invention seeks to provide such a chemical-mechanical polishing system and method. These and other advantages of the invention will be apparent from the description of the invention provided herein.

BRIEF SUMMARY OF THE INVENTION

The invention provides a polishing composition comprising (a) an oxidizing agent that oxidizes a noble metal, (b) an anion selected from the group consisting of sulfate, borate, nitrate, and phosphate, and (c) a liquid carrier.

The invention also provides a method of chemically-mechanically polishing a substrate, the method comprising (i) contacting a substrate comprising a noble metal with a chemical-mechanical polishing system comprising (a) an oxidizing agent that oxidizes a noble metal, (b) an anion selected from the group consisting of sulfate, borate, nitrate, and phosphate, (c) a polishing component selected from the group consisting of an abrasive, a polishing pad, and combinations thereof, and (d) a liquid carrier, and (ii) abrading at least a portion of the noble metal to polish the substrate.

The invention further provides a polishing composition for a substrate comprising ruthenium comprising (a) an oxidizing agent that oxidizes ruthenium above the +4 oxidation state, (b) a polishing additive selected from the group consisting of metal sequestering polymers, metal chelators, organic thiols, compounds that reduce ruthenium tetraoxide, lactones, and α-hydroxycarbonyl compounds, and (c) a liquid carrier.

The invention additionally provides a method of chemically-mechanically polishing a substrate comprising ruthenium comprising (i) contacting a substrate comprising ruthenium with a chemical-mechanical polishing system comprising (a) an oxidizing agent that oxidizes ruthenium above the +4 oxidation state, (b) a polishing additive selected from the group consisting of metal sequestering polymers, metal chelators, organic thiols, compounds that reduce ruthenium tetraoxide, lactones, and α-hydroxycarbonyl compounds, (c) a polishing component selected from the group consisting of an abrasive, a polishing pad, and combinations thereof, and (d) a liquid carrier, and (ii) abrading at least a portion of the substrate to polish the substrate.

DETAILED DESCRIPTION OF THE INVENTION

The invention provides a polishing composition comprising (a) an oxidizing agent that oxidizes a noble metal, (b) an anion selected from the group consisting of sulfate, borate, nitrate, and phosphate, and (c) a liquid carrier.

The oxidizing agent that oxidizes a noble metal can be any suitable oxidizing agent that oxidizes a noble metal. Desirably, the oxidizing agent that oxidizes a noble metal is selected from the group consisting of bromates, bromites, hypobromites, chlorates, chlorites, hypochlorites, perchlorates, iodates, hypoiodates, periodates, cerium (IV) salts, permanganates, silver (III) salts, peroxyacetic acid, organo-halo-oxy compounds, monoperoxy sulfates, monoperoxy sulfites, monoperoxy thiosulfates, monoperoxyphosphates, monoperoxypyrophosphates, monoperoxyhypophosphates, and combinations thereof. As utilized herein, the term "organo-halo-oxy compound" is used to refer to oxidizing agents which contain at least one organic functional group, at least one halogen atom, and at least one oxygen atom. The organic functional group(s), halogen atom(s), and oxygen atom(s) of the organo-halo-oxy compound can be arranged in any suitable manner, but will conform to one of three general formulas: $R_a$—X—$O_b$, $R_a$—$O_b$—X, or $O_b$—$R_a$—X, wherein R represents an organic functional group, X represents a halogen atom, and a and b are integers greater than or equal to one. Suitable organo-halo-oxy compounds include, but are not limited to, N-chlorosuccinimide, N-bromosuccinimide, N-bromoacetamide, N-bromobenzophenoneimine, iodine triacetate, iodine tris(trifluoroacetate), iodobenzene diacetate, pentrafluoroiodobenzene bis(trifluoroacetate), iodosobenzene, iodoxybenzene, iodoxybenzoic acid (e.g., m-iodoxybenzoic acid), salts thereof, and combinations thereof. Preferably, the oxidizing agent is selected from the group consisting of bromates, cerium (IV) salts, and monoperoxy sulfate. More preferably, the oxidizing agent is potassium bromate or potassium hydrogen peroxymonosulfate sulfate (which is commercially available under the trade name of Oxone® from DuPont).

The polishing composition can comprise any suitable amount of the oxidizing agent. Typically, the polishing composition comprises about 0.1 wt. % or more (e.g., about 0.2 wt. % or more, about 0.5 wt. % or more, or about 1 wt. % or more) oxidizing agent, based on the weight of the liquid carrier and any components dissolved or suspended therein. The polishing composition preferably comprises about 20 wt. % or less (e.g., about 15 wt. % or less, or about 10 wt. % or less) oxidizing agent, based on the weight of the liquid carrier and any components dissolved or suspended therein.

The anion is selected from the group consisting of sulfate, borate, nitrate, and phosphate, and combinations thereof. The anion can be provided by any suitable precursor, such as an inorganic salt, a partial salt, or an acid comprising the anion.

Desirably, the anion is provided by an inorganic salt comprising a cation and the anion. The cation can be any suitable cation. Preferably, the cation is potassium or sodium. More preferably, the inorganic salt is selected from the group consisting of potassium sulfate, sodium sulfate, potassium peroxymonosulfate sulfate, and combinations thereof.

Alternative sources of the sulfate include sulfuric acid as well as mono-salts (e.g., hydrogen sulfate) thereof. Alternative sources of the nitrate include the corresponding acid (i.e., nitric acid) as well as salts thereof. Alternative sources of the phosphate include phosphoric acid, as well as mono-salts (e.g., dihydrogen phosphates) and di-salts (e.g., hydrogen phosphate) thereof.

The anion desirably is present in the polishing composition in a concentration of about 0.05 M or more (e.g., about 0.05 M to about 2 M). Preferably, the anion is present in a concentration of about 2 M or less (e.g., about 1.5 M or less). The desired concentration of anion in the polishing composition can be achieved by any suitable means, such as by using about 0.5 wt. % to about 20 wt. % of a suitable precursor in the preparation of the polishing composition, based on the total weight of the polishing composition.

A polishing composition comprising an anion selected from the group consisting of sulfate, borate, nitrate, and phosphate desirably exhibits enhanced removal rates when used to polish substrates comprising noble metals. Without wishing to be bound by any particular theory, it is believed that the anion in conjunction with the oxidizing agent may form a soft, easily abradable compound of the noble metal on the surface of the substrate.

A liquid carrier is used to facilitate the application of the components of the polishing composition to the surface of a suitable substrate to be polished. The liquid carrier can be any suitable liquid carrier. Typically, the liquid carrier is water, a mixture of water and a suitable water-miscible solvent, or an emulsion. Preferably, the liquid carrier comprises, consists essentially of, or consists of water, more preferably deionized water.

The polishing composition desirably has a pH of about 8 or less (e.g., about 7 or less, or about 6 or less). Preferably, the polishing composition has a pH of about 1 to about 8, more preferably about 2 to about 6. The actual pH of the polishing composition will depend, in part, on the substrate being polished and on the oxidizing agent used in the polishing composition.

The pH of the polishing composition can be achieved and/or maintained by any suitable means. More specifically, the polishing composition can further comprise a pH adjustor, a pH buffering agent, or a combination thereof. The pH adjustor can be any suitable pH-adjusting compound. For example, the pH adjustor can be nitric acid, potassium hydroxide, or a combination thereof. The pH buffering agent can be any suitable buffering agent, for example, phosphates, sulfates, acetates, borates, ammonium salts, and the like. The polishing composition can comprise any suitable amount of a pH adjustor and/or a pH buffering agent, provided that a suitable amount is used to achieve and/or maintain the pH of the polishing composition within the ranges set forth.

It will be appreciated that components of the polishing composition may have more than one function. For example, sulfates when used in the polishing composition can serve to provide an enhanced polishing rate for a substrate comprising a noble metal as well as acting as a pH buffering agent. Potassium hydrogen peroxymonosulfate sulfate can serve as an oxidizing agent as well as a source of sulfate anion.

The polishing composition optionally comprises an abrasive. Any suitable abrasive can be used, many of which are well known in the art. Preferably, the abrasive is a metal oxide abrasive or diamond. The metal oxide abrasive desirably is selected from the group consisting of alumina, ceria, germania, magnesia, silica, titania, zirconia, co-formed products thereof, and combinations thereof. A preferred abrasive is alumina (e.g., α-alumina). The abrasive can be a mixture of two or more abrasives (e.g., a mixture of α-alumina and fumed alumina). The abrasive particles typically have an average particle size (e.g., average particle diameter) of about 20 nm to about 500 nm. Preferably, the abrasive particles have an average particle size of about 70 nm to about 300 nm (e.g., about 100 nm to about 200 nm).

The abrasive can consist of organic polymer particles. Examples of suitable organic abrasives include but are not limited to organic particles composed of polyoefins and polyolefin copolymers such as polyvinyl chloride-polystyrene copolymer, polyacetals, saturated polyesters, polyamides, polycarbonates, polyethylene, polypropylene, poly-1-butene and poly-4-methyl-1-pentene, phenoxy resins, and (meth)acrylic resins and acrylic polymers such as polymethyl methacrylate.

Any suitable amount of abrasive can be present in the polishing composition. Typically, about 0.001 wt. % or more abrasive can be present in the polishing composition. The amount of abrasive in the polishing composition preferably will not exceed about 10 wt. %, and more preferably will not exceed about 5 wt. % (e.g., will not exceed about 2 wt. %). Even more preferably the abrasive will comprise about 0.001 wt. % to about 2 wt. % of the polishing composition.

The abrasive desirably is suspended in the polishing composition, more specifically in the liquid carrier of the polishing composition. When the abrasive is suspended in the polishing composition, the abrasive preferably is colloidally stable. The term colloid refers to the suspension of abrasive particles in the liquid carrier. Colloidal stability refers to the maintenance of that suspension over time. In the context of this invention, an abrasive is considered colloidally stable if, when the abrasive is placed into a 100 ml graduated cylinder and allowed to stand unagitated for a time of 2 hours, the difference between the concentration of particles in the bottom 50 ml of the graduated cylinder ([B] in terms of g/ml) and the concentration of particles in the top 50 ml of the graduated cylinder ([T] in terms of g/ml) divided by the initial concentration of particles in the abrasive composition ([C] in terms of g/ml) is less than or equal to 0.5 (i.e., $\{[B]-[T]\}/[C] \leq 0.5$). The value of [B]–[T]/[C] desirably is less than or equal to 0.3, and preferably is less than or equal to 0.1.

Advantageously, the polishing composition of the invention exhibits useful removal rates for noble metals in the absence of an abrasive in the polishing composition. If an abrasive is desired, the enhanced removal rates exhibited by the inventive polishing composition allow for use of low amounts of abrasive (e.g., less than about 1 wt. %). Low abrasive levels desirably allow for useful removal rates of noble metals while minimizing defectivity and excessive removal rates of other components of the substrate observed with higher abrasive levels (e.g., greater than about 1 wt. %).

The polishing composition optionally further comprises a surfactant. The surfactant can be any suitable surfactant. Suitable surfactants include, for example, cationic surfactants, anionic surfactants, nonionic surfactants, amphoteric surfactants, mixtures thereof, and the like. Preferably, the polishing system comprises a nonionic surfactant. An example of a suitable nonionic surfactant is an ethylenediamine polyoxyethylene surfactant. When a surfactant is present in the polishing composition, any suitable amount of the surfactant can be present in the polishing composition. The amount of surfactant typically is about 0.0001 wt. % to about 1 wt. % (preferably about 0.001 wt. % to about 0.1 wt. %, or about 0.005 wt. % to about 0.05 wt. %) based on the weight of the liquid carrier and any components dissolved or suspended therein.

The polishing composition optionally further comprises an antifoaming agent. The anti-foaming agent can be any suitable anti-foaming agent and can be present in the polishing composition in any suitable amount. Suitable antifoaming agents include, but are not limited to, silicon-based and acetylenic diol-based antifoaming agents. The amount of anti-foaming agent present in the polishing composition typically is about 40 ppm to about 140 ppm.

The polishing composition optionally further comprises a biocide. The biocide can be any suitable biocide and can be present in the polishing composition in any suitable amount. A suitable biocide is an isothiazolinone biocide. The amount of biocide used in the polishing composition typically is about 1 to about 50 ppm, preferably about 10 to about 20 ppm.

The invention further provides a method for polishing a substrate comprising a noble metal with the polishing composition as described herein. In particular, the invention provides a method of polishing a substrate comprising a noble metal, which method comprises the steps of (i) contacting a substrate comprising a noble metal with a chemical-mechanical polishing system comprising (a) an oxidizing agent that oxidizes a noble metal, (b) an anion selected from the group consisting of sulfate, borate, nitrate, and phosphate, (c) a polishing component selected from the group consisting of an abrasive, a polishing pad, and combinations thereof, and (d) a liquid carrier, and (ii) abrading at least a portion of the noble metal to polish the substrate.

The liquid carrier and the components of the polishing system suspended therein (i.e., the oxidizing agent that oxidizes a noble metal, the anion, and optionally the abrasive and/or other components) constitute the polishing composition of the polishing system. The polishing system typically comprises a polishing pad in addition to the polishing composition. The characteristics of the polishing composition and the components thereof, such as the oxidizing agent, anion, liquid carrier, pH, and optional additives, are as described herein.

When the method comprises a polishing component that is an abrasive suspended in the liquid carrier of the polishing composition, the abrasive, the amount of abrasive, and other characteristics of the abrasive, such as the particle size and colloidal stability of the abrasive, are as described herein for the polishing composition. In a preferred embodiment, the abrasive is suspended in the liquid carrier and used in conjunction with a polishing pad. In another embodiment, the inventive method comprises the use of an abrasive that is affixed to the polishing pad. Numerous methods for affixing abrasives to polishing pads are well known in the art. In still another embodiment, the polishing component of the inventive method comprises an abrasive-free polishing pad.

The substrate can comprise any suitable noble metal. Suitable noble metals include, but are not limited to, platinum, iridium, rhenium, ruthenium, rhodium, palladium, silver, osmium, gold, combinations thereof, and alloys thereof. Preferably, the substrate comprises ruthenium, iridium, platinum, and combinations thereof. Suitable substrates include but are not limited to integrated circuits, interlayer dielectric (ILD) devices, semiconductors, and the like.

The invention further provides a polishing composition for a substrate comprising ruthenium comprising (a) an oxidizing agent that oxidizes ruthenium above the +4 oxidation state, (b) a polishing additive selected from the group consisting of metal sequestering polymers, metal chelators, organic thiols, compounds that reduce ruthenium tetraoxide, lactones, and α-hydroxycarbonyl compounds, and (c) a liquid carrier.

The oxidizing agent can be any suitable oxidizing agent that oxidizes ruthenium above the +4 state. Preferred oxidizing agents that oxidize ruthenium above the +4 state are selected from the group consisting of bromates, bromites, hypobromites, chlorates, chlorites, hypochlorites, perchlorates, iodates, hypoiodates, periodates, cerium (IV) salts, permanganates, silver (III) salts, peroxyacetic acid, organohalo-oxy compounds, monoperoxy sulfates, monoperoxy sulfites, monoperoxy thiosulfates, monoperoxyphosphates, monoperoxypyrophosphates, monoperoxyhypophosphates, and combinations thereof, wherein organo-halo-oxy compounds are as described herein. More preferably, the oxidizing agent is selected from the group consisting of bromates, cerium (IV) salts, and monoperoxy sulfate. Most preferably, the oxidizing agent is potassium bromate or potassium hydrogen peroxymonosulfate sulfate (which is commercially available under the trade name of Oxone® from DuPont).

The polishing composition comprises a polishing additive selected from the group consisting of metal sequestering polymers, metal chelators, organic thiols, compounds that reduce ruthenium tetraoxide, lactones, and α-hydroxycarbonyl compounds. When ruthenium is contacted with a polishing composition comprising an oxidizing agent that oxidizes ruthenium above the +8 state, ruthenium tetraoxide can be formed, depending on the oxidizing agent, the pH, and other components of the polishing composition. The function of the polishing additive is to suppress the formation of or reduce the amount of ruthenium tetraoxide that can be present in the polishing composition.

The polishing additive can be present in any suitable amount. Typically, the polishing additive is present in an amount of about 0.01 wt. % or more (e.g., about 0.05 wt. % or more, or about 0.1 wt. % or more, or about 0.2 wt. % or more), based on the total weight of the polishing composition. Preferably, the polishing additive will be present in an amount of about 10 wt. % or less (e.g., about 5 wt. % or less, or about 2.5 wt. % or less) based on the total weight of the polishing composition.

The polishing additive can be any suitable metal sequestering polymer. A metal sequestering polymer is a polymer that binds at least one metal. Preferred metal sequestering polymers include, for example, homopolymeric polyethyleneimines and hexamethrine bromide. The homopolymeric polyethyleneimines can have any suitable molecular weight, degree of branching, and proportion of primary, secondary, and tertiary amines. Hexamethrine bromide can have any molecular weight. Additionally, the bromide anions of hexamethrine bromide can be exchanged with any suitable anion. Numerous methods for exchanging the anions of cationic polymers are known in the art. As those of ordinary skill in the art will readily understand, the aforementioned polymers can be protonated or unprotonated/deprotonated depending upon the pH of the polishing composition and the $pK_a$ of the particular polymer. More specifically, if the pH of the polishing composition is less than the $pK_a$ of the polymer, the aforementioned unit of the polymer will be protonated. If, however, the pH of the polishing composition is greater than the $pK_a$ of the polymer, the aforementioned unit of the polymer will be unprotonated/deprotonated.

The polishing additive can be any suitable metal chelator. The term "metal chelator" as used herein refers to a compound that forms a complex with at least one metal ion. Preferred metal chelators include, for example, maleic acid, malonic acid, 1,10-phenanthroline, 2-pyridylacetic acid, 5-formylfuran sulfonic acid, N-tris(hydroxymethyl)methyl-2-aminoethanesulfonic acid, tartaric acid, itaconic acid, chelidonic acid, 3-methyl-1,2-cyclopentanedione, and glycolamide.

The polishing additive can be any suitable organic thiol. The organic thiol desirably is selected from the group consisting of alkyl mercaptans and aryl mercaptans. Preferred organic thiols include, for example, methionine and dodecanethiol.

The polishing additive can be any suitable compound that reduces ruthenium tetraoxide. Compounds that reduce ruthenium tetraoxide are defined herein as compounds that cause a visible color change when added to an aqueous solution of ruthenium tetraoxide produced in situ by oxidation of an acidic aqueous solution of ruthenium dioxide with potassium bromate. Preferred compounds capable of reducing ruthenium tetraoxide include, for example, ascorbic acid, pyrogallol, sodium sulfite, acetoacetamide, 3-amino-1,2,4-triazole, hypophosphorous acid, sulfurous acid, 3-hydroxy-2-methyl-4-pyrone, pyrocatechol violet, 1,2,3-trihydroxybenzene, 1,2,4-trihydroxybenzene, 1,2,5-trihydroxybenzene, 1,3,4-trihydroxybenzene, 1,3,5-trihydroxybenzene, and 4-hydroxybenzamide.

The polishing additive can be any suitable lactone. Preferred lactones include, for example, dehydroascorbic acid, α-D-glucoheptonic-γ-lactone, dihydro-4,4-dimethyl-2,3-furanedione, tetronic acid, methyl coumalate, and 4-hydroxy-6-methyl-2-pyrone.

The polishing additive can be any suitable α-hydroxycarbonyl compound. The class of α-hydroxycarbonyl compounds includes addition compounds with water or hydroxyl-containing compounds (e.g., alcohols) such as hemiacetals, acetals, cyclic hemiacetals derived by intramolecular cyclization of α-hydroxycarbonyl compounds comprising at least one additional hydroxyl group (e.g., D-(+)-glucose), cyclic acetals, hydrated aldehydes, hemiketals, ketals, cyclic derivatives thereof (e.g., 2,2-dialkyl-1,3-dioxolanes), and the like. Preferred α-hydroxycarbonyl compounds include, for example, lactic acid, α-hydroxy-γ-butyrolactone, lactobionic acid, D-(+)-glucose, and α-D-glucoheptonic-γ-lactone.

It will be appreciated that the polishing additive can belong to one or more of the aforementioned groups, and can have more than one function. For example, α-D-glucoheptonic-γ-lactone is both a lactone as well as an α-hydroxycarbonyl compound. Tetronic acid is a lactone as well as a metal chelator.

The polishing composition for a substrate comprising ruthenium optionally comprises an anion selected from the group consisting of sulfate, borate, nitrate, phosphate, and combinations thereof. The characteristics and the amount of the anion present in the polishing composition are as described herein.

In certain embodiments, the polishing composition for a substrate comprising ruthenium optionally comprises an abrasive. When an abrasive is present in the polishing composition, the abrasive, the amount of abrasive, and other characteristics of the abrasive, such as the particle size and colloidal stability of the abrasive, are as described herein.

The other characteristics of the polishing composition for a substrate comprising ruthenium, such as the liquid carrier, optional additives, and pH, are as described herein.

The invention further provides a method for polishing a substrate comprising ruthenium with the polishing composition for a substrate comprising ruthenium as described herein. In particular, the invention provides a method of polishing a substrate comprising ruthenium, which method comprises the steps of (i) contacting a substrate comprising ruthenium with a chemical-mechanical polishing system comprising (a) an oxidizing agent that oxidizes ruthenium above the +4 oxidation state, (b) a polishing additive selected from the group consisting of metal sequestering polymers, metal chelators, organic thiols, compounds that reduce ruthenium tetraoxide, lactones, and α-hydroxycarbonyl compounds, (c) a polishing component selected from the group consisting of an abrasive, a polishing pad, and combinations thereof, and (d) a liquid carrier, and (ii) abrading at least a portion of the substrate to polish the substrate.

The liquid carrier and the components of the polishing system suspended therein (i.e., the oxidizing agent that oxidizes ruthenium above the +4 oxidation state, the polishing additive, and optionally the abrasive and/or other components) constitute the polishing composition of the polishing system. The polishing system typically comprises a polishing pad in addition to the polishing composition. The characteristics of the polishing composition and the components thereof, such as the oxidizing agent, polishing additive, liquid carrier, pH, and optional additives, are as described herein for the polishing composition for a substrate comprising ruthenium.

When the method comprises a polishing component that is an abrasive suspended in the liquid carrier of the polishing composition, the abrasive, the amount of abrasive, and other characteristics of the abrasive, such as the particle size and colloidal stability of the abrasive, are as described herein for the polishing composition for a substrate comprising ruthenium. In a preferred embodiment, the abrasive is suspended in the liquid carrier and used in conjunction with a polishing pad. In another embodiment, the inventive method comprises the use of an abrasive that is affixed to the polishing pad. Numerous methods for affixing abrasives to polishing pads are well known in the art. In still another embodiment, the polishing component of the inventive method comprises an abrasive-free polishing pad.

The substrate of the inventive method for polishing a ruthenium-containing substrate can be any suitable substrate comprising ruthenium. Suitable substrates include integrated circuits, interlayer dielectric (ILD) devices, semiconductors, and the like. The substrate may comprise a ruthenium layer and a second layer that is different than the ruthenium layer. The second layer typically comprises silicon dioxide, an adhesion-promoting layer such as titanium or tantalum, and/or a diffusion barrier layer such as titanium nitride or tantalum nitride, or other high- or low-κ dielectric materials.

A substrate can be planarized or polished with the polishing compositions described herein and/or in accordance with the inventive methods described herein by any suitable technique. The polishing methods of the invention are particularly suited for use in conjunction with a chemical-mechanical polishing (CMP) apparatus. Typically, the apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving relative to the surface of the polishing pad. The polishing of the substrate takes place by the substrate being placed in contact with the polishing pad and the polishing composition of the invention and then the polishing pad moving relative to the substrate, so as to abrade at least a portion of the substrate to polish the substrate.

The polishing composition of the invention can be produced by any suitable technique, many of which are known to those skilled in the art. The polishing composition can be prepared in a batch or continuous process. Generally, the polishing composition is prepared by combining the components of the polishing composition. The term "component" as used herein includes individual ingredients (e.g., abrasives, acids, oxidizing agents, etc.) as well as any combination of ingredients (e.g., corrosion inhibitors, surfactants, etc.).

For example, the polishing composition can be prepared by (i) providing all or a portion of the liquid carrier, (ii) dispersing the anion precursor or polishing additive in the liquid carrier, along with the optional abrasive, using any suitable means for preparing such a dispersion, (iii) adjusting the pH of the dispersion as appropriate, (iv) optionally adding suitable amounts of an acid, a surfactant, an oxidizing agent, a corrosion inhibitor, or combinations thereof to the mixture, and (v) adding the oxidizing agent to the mixture.

The polishing composition of the invention can be supplied as a multi-package system with one or more components of the polishing composition in separate compositions that are combined prior to use. For example, a first package can comprise all of the polishing composition except for the oxidizing agent and optionally a portion of the liquid carrier. The oxidizing agent can be placed in a second package either in pure form or in a mixture with all or a portion of the liquid carrier, e.g., water, for the polishing composition. The oxidizing agent desirably is provided separately and is combined, e.g., by the end-user, with the other components of the polishing composition shortly before use (e.g., 1 week or less prior to use, 1 day or less prior to use, 1 hour or less prior to use, 10 minutes or less prior to use, or 1 minute or less prior to use). Other two-package, or three- or more package, combinations of the components of the polishing composition of the invention are within the knowledge of one of ordinary skill in the art.

While the polishing composition can be prepared well before, or even shortly before, use, the polishing composition also can be produced by mixing the components of the polishing composition at or near the point-of-use. As utilized herein, the term "point-of-use" refers to the point at which the polishing composition is applied to the substrate surface (e.g., the polishing pad or the substrate surface itself). When the polishing composition is to be produced using point-of-use mixing, the components of the polishing composition are separately stored in two or more storage devices.

In order to mix components contained in storage devices to produce the polishing composition at or near the point-of-use, the storage devices typically are provided with one or more flow lines leading from each storage device to the point-of-use of the polishing composition (e.g., the platen, the polishing pad, or the substrate surface). By the term "flow line" is meant a path of flow from an individual storage container to the point-of-use of the component stored therein. The one or more flow lines can each lead directly to the point-of-use, or, in the case that more than one flow line is used, two or more of the flow lines can be combined at any point into a single flow line that leads to the point-of-use. Furthermore, any of the one or more flow lines (e.g., the individual flow lines or a combined flow line) can first lead to one or more of the other devices (e.g., pumping device, measuring device, mixing device, etc.) prior to reaching the point-of-use of the component(s).

The components of the polishing composition can be delivered to the point-of-use independently (e.g., the components are delivered to the substrate surface whereupon the components are mixed during the polishing process), or the components can be combined immediately before delivery to the point-of-use. Components are combined "immediately before delivery to the point-of-use" if they are combined less than 10 seconds prior to reaching the point-of-use, preferably less than 5 seconds prior to reaching the point-of-use, more preferably less than 1 second prior to reaching the point of use, or even simultaneous to the delivery of the components at the point-of-use (e.g., the components are combined at a dispenser). Components also are combined "immediately before delivery to the point-of-use" if they are combined within 5 m of the point-of-use, such as within 1 m of the point-of-use or even within 10 cm of the point-of-use (e.g., within 1 cm of the point of use).

When two or more of the components of the polishing composition are combined prior to reaching the point-of-use, the components can be combined in the flow line and delivered to the point-of-use without the use of a mixing device. Alternatively, one or more of the flow lines can lead into a mixing device to facilitate the combination of two or more of the components. Any suitable mixing device can be used. For example, the mixing device can be a nozzle or jet (e.g., a high pressure nozzle or jet) through which two or more of the components flow. Alternatively, the mixing device can be a container-type mixing device comprising one or more inlets by which two or more components of the polishing slurry are introduced to the mixer, and at least one outlet through which the mixed components exit the mixer to be delivered to the point-of-use, either directly or via other elements of the apparatus (e.g., via one or more flow lines). Furthermore, the mixing device can comprise more than one chamber, each chamber having at least one inlet and at least one outlet, wherein two or more components are combined in each chamber. If a container-type mixing device is used, the mixing device preferably comprises a mixing mechanism to further facilitate the combination of the components. Mixing mechanisms are generally known in the art and include stirrers, blenders, agitators, paddled baffles, gas sparger systems, vibrators, etc.

A substrate can be planarized or polished with the polishing composition with any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof.

Desirably, the CMP apparatus further comprises an in situ polishing endpoint detection system, many of which are known in the art. Techniques for inspecting and monitoring the polishing process by analyzing light or other radiation reflected from a surface of the workpiece are known in the art. Such methods are described, for example, in U.S. Pat. Nos. 5,196,353, 5,433,651, 5,609,511, 5,643,046, 5,658,183, 5,730,642, 5,838,447, 5,872,633, 5,893,796, 5,949,927, and 5,964,643. Desirably, the inspection or monitoring of the progress of the polishing process with respect to a workpiece being polished enables the determination of the polishing end-point, i.e., the determination of when to terminate the polishing process with respect to a particular workpiece.

The following examples further illustrate the invention but, of course, should not be construed as in any way limiting its scope.

EXAMPLE 1

This example demonstrates the effect of addition of sulfate to a polishing composition containing potassium bromate as an oxidizing agent on the polishing of a ruthenium-containing substrate.

Two similar substrates comprising ruthenium, silicon oxide, and silicon nitride were polished with different polishing compositions (Polishing Compositions 1A and 1B). Each polishing composition was mixed at the substrate via delivery of two separate flow streams to the substrate. The first flow stream consisted of 0.3 wt. % alpha alumina dispersed in water and was delivered at a flow rate of 25 mL/min. The second flow stream consisted of 3.6 wt. % solution of $KBrO_3$ in water and was delivered at a flow rate of 125 mL/min. Polishing Composition 1B was the same as Polishing Composition 1A except that it further contained 3.6 wt. % of $K_2SO_4$ delivered via the second flow stream.

The ruthenium removal rate (RR), within-wafer-non-uniformity (WIWNU), and silicon oxide removal rate (oxide RR) were determined for both of the chemical-mechanical polishing compositions. The WIWNU is a percentage calculated by dividing the standard deviation of removal rate by the average removal rate over the substrate and multiplying by 100, and is a measure of polishing uniformity. The results are summarized in Table 1.

TABLE 1

Effect of Sulfate in Bromate-Containing Polishing Compositions

| Polishing Composition | Ru RR (Å/min) | WIWNU (%) | Oxide RR (Å/min) |
| --- | --- | --- | --- |
| 1A (comparative) | 2065 | 7.6 | 0 |
| 1B (invention) | 3111 | 9.7 | 0 |

As is apparent from the results set forth in Table 1, the presence of $K_2SO_4$ resulted in an approximately 51% increase in the ruthenium removal rate. In both cases, the oxide removal rate was essentially zero. Thus, the results of this example demonstrate the significance of the anions present in the polishing composition and the beneficial effects resulting from the presence of sulfate ions in the polishing composition of the invention.

EXAMPLE 2

This example demonstrates the effect of addition of sulfate to a polishing composition containing potassium hydrogen peroxymonosulfate sulfate (Oxone®) as oxidizing agent on the polishing of a ruthenium-containing substrate.

Similar substrates comprising ruthenium, silicon oxide, and silicon nitride were polished with different polishing compositions (Polishing Compositions 2A, 2B, and 2C). Each of Polishing Compositions 2A–2C contained 100 ppm of alpha alumina and 1% of potassium hydrogen peroxymonosulfate sulfate in water at a pH of 6, and were prepared prior to use. Polishing Compositions 2B and 2C further contained $K_2SO_4$ in amounts listed in Table 2.

The ruthenium removal rate (RR), within-wafer-non-uniformity (WIWNU), and silicon oxide removal rate (oxide RR) were determined for each of the chemical-mechanical polishing compositions. The results are summarized in Table 2.

TABLE 2

Effect of Sulfate in Potassium Hydrogen Peroxymonosulfate Sulfate-Containing Polishing Compositions

| Polishing Composition | $K_2SO_4$ (wt. %) | Ru RR (wt. %) | WIWNU (%) | Oxide RR (Å/min) |
| --- | --- | --- | --- | --- |
| 2A (comparative) | 0 | 1930 | 10.1 | 5 |
| 2B (invention) | 1 | 2931 | 15.0 | 3 |
| 2C (invention) | 3 | 1128 | 13.2 | 0 |

As is apparent from the results set forth in Table 2, the presence of 1 wt. % of $K_2SO_4$ resulted in an approximately 52% increase in the ruthenium removal rate, whereas the presence of 3 wt. % of $K_2SO_4$ resulted in an approximately 42% decrease in the ruthenium removal rate, as compared to Polishing Composition 2A. These results suggest that there may be an upper limit to the beneficial effect of $K_2SO_4$ in the polishing composition. In all cases, the oxide removal rate was essentially zero. Thus, the results of this example demonstrate the beneficial effects of additional sulfate anion in the polishing composition of the invention.

EXAMPLE 3

This example demonstrates the effect of addition of sulfate to a polishing composition containing hydrogen peroxide as oxidizing agent on the polishing of a ruthenium-containing substrate.

Similar substrates comprising ruthenium, silicon oxide, and silicon nitride were polished with different polishing compositions (Polishing Compositions 3A and 3B). Each of Polishing Compositions 3A and 3B contained 0.05 wt. % of alpha alumina and 1 wt. % of hydrogen peroxide in water, at a pH of 2, and were prepared prior to use. Polishing Composition 3B further contained 5 wt. % of $K_2SO_4$.

The ruthenium removal rate (RR), within-wafer-non-uniformity (WIWNU), and silicon oxide removal rate (oxide RR) were determined for both of the chemical-mechanical polishing compositions, and the results are summarized in Table 3.

TABLE 3

Effect of Sulfate in Hydrogen Peroxide-Containing Polishing Compositions

| Polishing Composition | $K_2SO_4$ (wt. %) | Ru RR (wt. %) | WIWNU (%) | Oxide RR (Å/min) |
| --- | --- | --- | --- | --- |
| 3A (comparative) | 0 | 337 | 19.0 | 23 |
| 3B (comparative) | 5 | 234 | 16.9 | 8 |

As is apparent from the data set forth in Table 3, the ruthenium removal rate for both comparative polishing compositions was very low compared to polishing compositions comprising potassium bromate or potassium hydrogen peroxymonosulfate sulfate. Furthermore, $K_2SO_4$ did not accelerate the ruthenium removal rate when present at 5 wt. % in the polishing composition. Thus, the results of this example demonstrate the lack of enhancement in ruthenium removal rate by sulfate in a composition comprising an oxidizing agent other than an oxidizing agent that oxidizes a noble metal as used in the polishing composition of the invention.

EXAMPLE 4

This example demonstrates the utility of the polishing composition of the invention in polishing an iridium-containing substrate.

Similar substrates comprising iridium, silicon oxide, and silicon nitride were polished with different polishing compositions (Polishing Compositions 4A, 4B, and 4C). Each of Polishing Compositions 4A–4C contained 0.5 wt. % of alpha alumina in water at a pH of 4, and were prepared prior to use. Polishing Composition 4B further contained 2.4 wt. % of potassium hydrogen peroxymonosulfate sulfate, and Polishing Composition 4C further contained 0.44 wt. % of $KBrO_3$.

The iridium removal rate (RR), within-wafer-non-uniformity (WIWNU), and silicon oxide (oxide) removal rate (RR) were determined for each of the chemical-mechanical polishing compositions, and the results are summarized in Table 4.

TABLE 4

Iridium Polishing Results

| Polishing Composition | Ir RR (Å/min) | WIWNU (%) | Oxide RR (Å/min) |
|---|---|---|---|
| 4A (comparative) | 0 | Not measured | Not measured |
| 4B (invention) | 68 | 24.1 | 193 |
| 3C (invention) | 176 | 18.1 | 53 |

As is apparent from the results set forth in Table 4, the addition of potassium hydrogen peroxymonosulfate sulfate or $KBrO_3$ to a polishing composition containing 0.5 wt. % alpha alumina resulted in useful rates of iridium removal. In this example, iridium removal rate with $KBrO_3$ as the oxidizing agent was approximately twice the rate observed with use of potassium hydrogen peroxymonosulfate sulfate as the oxidizing agent in the polishing composition.

EXAMPLE 5

This example illustrates the utility of the inventive polishing compositions on substrates comprising platinum.

Similar substrates comprising platinum and silicon oxide were polished with different polishing compositions (Polishing Compositions 5A and 5B). Polishing Compositions 5A and 5B contained 1.8% alpha alumina and 1.2% fumed alumina dispersed in water at a pH of 3, and were prepared prior to use. Polishing Composition 5B further contained 3 wt. % potassium hydrogen peroxymonosulfate sulfate.

The platinum removal rate (RR), within-wafer-non-uniformity (WIWNU), and silicon oxide removal rate (oxide RR) were determined for each of the chemical-mechanical polishing compositions, and the results are summarized in Table 5. In this example, the platinum removal rate was calculated as the diameter removal rate, which is an average of substrate thickness measured at evenly spaced intervals across the substrate.

TABLE 5

Platinum Polishing Results

| Polishing Composition | Pt RR (Å/min) | WIWNU (%) | Oxide RR (Å/min) |
|---|---|---|---|
| 4A (control) | 323 | 99 | 4.5 |
| 4B (invention) | 484 | 26 | 11 |

As is apparent from the results set forth in Table 5, the addition of potassium hydrogen peroxymonosulfate sulfate to a polishing composition containing a mixture of alpha alumina and fumed alumina resulted in an approximately 50% increase in platinum removal rate. Furthermore, the within-wafer-non-uniformity (WIWNU) was reduced by more than two-thirds. Thus, the substantially higher polishing rate observed in connection with the inventive polishing composition as compared to the control polishing composition was accompanied by an increase in polishing uniformity of the substrate surface.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A polishing composition comprising:
   (a) an oxidizing agent that oxidizes a noble metal,
   (b) an anion selected from the group consisting of sulfate, borate, nitrate, and phosphate, and
   (c) a liquid carrier;
wherein the oxidizing agent that oxidizes a noble metal is selected from the group consisting of bromates, bromites, hypobromites, chlorates, chlorites, hypochlorites, perchlorates, iodates, hypoiodates, periodates, cerium (IV) salts, permanganate, silver (III) salts, peroxyacetic acid, organohalo-oxy compounds, monoperoxy sulfate, monoperoxy sulfite, monoperoxy thiosulfate, monoperoxyphosphate, monoperoxypyrophosphate, and monoperoxyphosphate.

2. The polishing composition of claim 1, wherein the oxidizing agent is potassium hydrogen peroxymonosulfate sulfate.

3. The polishing composition of claim 1, wherein the oxidizing agent is a bromate.

4. The polishing composition of claim 1, wherein the anion selected from the group consisting of sulfate, borate, nitrate, and phosphate is present in a concentration of about 0.05 M to about 2 M.

5. The polishing composition of claim 1, wherein the liquid carrier comprises water.

6. The polishing composition of claim 5, wherein the pH of the polishing composition is about 1 to about 8.

7. The polishing composition of claim 6, wherein the pH of the polishing composition is about 2 to about 6.

8. The polishing composition of claim 1, wherein the polishing composition further comprises an abrasive.

9. The polishing composition of claim 8, wherein the abrasive is a metal oxide.

10. The polishing composition of claim 9, wherein the metal oxide is selected from the group consisting of alumina, ceria, germania, magnesia, silica, titania, zirconia, co-formed products thereof, diamond, organic polymer particles, and combinations thereof.

11. A polishing composition for a substrate comprising ruthenium comprising:
(a) an oxidizing agent that oxidizes ruthenium above the +4 oxidation state,
(b) a polishing additive selected from the group consisting of metal sequestering polymers, metal chelators, organic thiols, compounds that reduce ruthenium tetraoxide, lactones, and α-hydroxycarbonyl compounds, and
(c) a liquid carrier.

12. The polishing composition of claim 11, wherein the oxidizing agent is selected from the group consisting of bromates, bromites, hypobromites, chlorates, chlorites, hypochlorites, perchlorates, iodates, hypoiodates, periodates, cerium (IV) salts, permanganate, silver (III) salts, peroxyacetic acid, organo-halo-oxy compounds, monoperoxy sulfate, monoperoxy sulfite, monoperoxy thiosulfate, monoperoxyphosphate, monoperoxypyrophosphate, and monoperoxyhypophosphate.

13. The polishing composition of claim 12, wherein the oxidizing agent is potassium hydrogen peroxymonosulfate sulfate.

14. The polishing composition of claim 12, wherein the oxidizing agent is a bromate.

15. The polishing composition of claim 11, further comprising an anion selected from the group consisting of sulfate, borate, nitrate, and phosphate.

16. The polishing composition of claim 15, wherein the anion selected from the group consisting of sulfate, borate, nitrate, and phosphate is present in a concentration of about 0.05 M to about 2 M.

17. The polishing composition of claim 11, wherein the polishing additive is a metal sequestering polymer selected from the group consisting of homopolymeric polyethyleneimines and hexamethrine bromide.

18. The polishing composition of claim 11, wherein the polishing additive is a metal chelator selected from the group consisting of maleic acid, malonic acid, 1,10-phenanthroline, 2-pyridylacetic acid, 5-formylfuran sulfonic acid, N-tris(hydroxymethyl)methyl-2-aminoethanesulfonic acid, tartaric acid, itaconic acid, chelidonic acid, 3-methyl-1,2-cyclopentanedione, and glycolamide.

19. The polishing composition of claim 11, wherein the polishing additive is a organic thiol selected from the group consisting of alkyl mercaptans and aryl mercaptans.

20. The polishing composition of claim 11, wherein the polishing additive is a compound that reduces ruthenium tetraoxide selected from the group consisting of ascorbic acid, pyrogallol, sodium sulfite, acetoacetamide, 3-amino-1,2,4-triazole, hypophosphorous acid, sulfurous acid, 3-hydroxy-2-methyl-4-pyrone, pyrocatechol violet, 1,2,3-trihydroxybenzene, 1,2,4-trihydroxybenzene, 1,2,5-trihydroxybenzene, 1,3,4-trihydroxybenzene, 1,3,5-trihydroxybenzene, and 4-hydroxybenzamide.

21. The polishing composition of claim 11, wherein the polishing additive is a lactone compound selected from the group consisting of dehydroascorbic acid, α-D-glucoheptonic-γ-lactone, dihydro-4,4-dimethyl-2,3-furanedione, tetronic acid, methyl coumalate, and 4-hydroxy-6-methyl-2-pyrone.

22. The polishing composition of claim 11, wherein the polishing additive is an α-hydroxycarbonyl compound selected from the group consisting of lactic acid, α-hydroxy-γ-butyrolactone, lactobionic acid, D-(+)-glucose, and α-D-glucoheptonic-γ-lactone.

23. The polishing composition of claim 11, wherein the polishing composition further comprises an abrasive suspended in the liquid carrier, and the abrasive is a metal oxide selected from the group consisting of alumina, ceria, germania, magnesia, silica, titania, zirconia, co-formed products thereof, diamond, organic polymer particles, and combinations thereof.

24. The polishing composition of claim 11, wherein the liquid carrier comprises water.

25. The polishing composition of claim 24, wherein the pH of the polishing composition is about 1 to about 8.

26. The polishing composition of claim 25, wherein the pH of the polishing composition is about 2 to about 6.

* * * * *